US008735528B1

(12) United States Patent
Tan et al.

(10) Patent No.: US 8,735,528 B1
(45) Date of Patent: *May 27, 2014

(54) TWO-PHOTON ABSORBING CROSS-LINKED POLYURETHANES CONTAINING DIPHENYLAMINO-DIALKYLFLUORENE-1,3,5-TRIAZINE UNITS

(71) Applicant: The United States of America, as represented by the Secretary of the Air Force, Washington, DC (US)

(72) Inventors: Loon-Seng Tan, Centerville, OH (US); Matthew J Dalton, Bellbrook, OH (US); Ramamurthi Kannan, Cincinnati, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/632,195

(22) Filed: Oct. 1, 2012

Related U.S. Application Data

(63) Continuation-in-part of application No. 13/237,078, filed on Sep. 20, 2011, now Pat. No. 8,318,888.

(51) Int. Cl.
H05B 33/14 (2006.01)
(52) U.S. Cl.
USPC .......................................... 528/73; 548/152
(58) Field of Classification Search
CPC ...................................................... H05B 33/14
See application file for complete search history.

(56) References Cited

U.S. PATENT DOCUMENTS

| | | |
|---|---|---|
| 6,300,502 B1 | 10/2001 | Kannan et al. |
| 6,538,098 B1 | 3/2003 | Goldfinger |
| 6,555,682 B1 | 4/2003 | Kannan et al. |
| 6,680,016 B2 | 1/2004 | Wang et al. |
| 6,730,793 B1 | 5/2004 | Kannan et al. |
| 6,849,707 B1 | 2/2005 | Baek et al. |
| 6,867,304 B1 | 3/2005 | Tan et al. |
| 6,974,857 B1 | 12/2005 | Baek et al. |
| 7,005,550 B1 | 2/2006 | Tan et al. |
| 7,026,432 B2 | 4/2006 | Charati et al. |
| 7,067,674 B1 | 6/2006 | Kannan et al. |
| 7,319,151 B1 | 1/2008 | Tan et al. |
| 7,807,127 B1 | 10/2010 | Forohar et al. |
| 7,960,471 B1 | 6/2011 | Tan et al. |
| 8,173,763 B1 | 5/2012 | Tan et al. |
| 8,318,888 B1 * | 11/2012 | Tan et al. ........................ 528/73 |
| 8,580,958 B1 | 11/2013 | Tan et al. |

OTHER PUBLICATIONS

Dalton, Matthew J. et al., "Aromatic Polyimides Containing Main-Chain DiphenylaminofLuorene-Benzothiazole Motif: Fluorescence Quenching, Two-Photon Properties, and Exciplex Formation in a Solid State," Macromolecules 2011, 44(18), 7194-7206.

Jhaveri, Shalin J. et al., "Direct Three-Dimensional Microfabrication of Hydrogels via Two-Photon Lithography in Aqueous Solution," Chemistry of Materials (2009), 21(10), 2003-2006.
Rogers, Joy E. et al., "Insight into the Nonlinear Absorbance of Two Related Series of Two-Photon Absorbing Chromophores," Journal of Physical Chemistry A (2007), 111(10), 1899-1906.
He, Guang S. et al., "Multiphoton Absorbing Materials: Molecular Designs, Characterizations, and Applications," Chemical Reviews (Washington, DC, United States) (2008), 108(4), 1245-1330.
He, Guang S. et al., "Degenerate Two-Photon-Absorption Spectral Studies of Highly Two-Photon Active Organic Chromophores," Journal of Chemical Physics (2004), 120(11), 5275-5284.
Ambrosio, A. et al., Two-Photon Patterning of a Polymer Containing Y-Shaped Azochromophores, Applied Physics Letters (2009), 94(1), 011115/1-011115/3.
Dong-Sean Won et al., "Synthesis and Nonlinear Optical Properties of a Novel Polyurethane Containing Cyanovinylthiophene with Enhanced Thermal Stability of Dipole Alignment for Electro-optic Applications," Polymer International (2010), 59(2), pp. 162-168.
Beecher, J.E. et al., "Concurrent Stabilization and Imaging of a Novel Polymer for Second Harmonic Generation via in situ Photopolymerization," From Report (1994), (TR-14-ONR; Order No. AD-A278 912), 70 pp. Language: English, Database: CAPLUS.
Yuxia, Z. et al., "Synthesis and Characterization of a Novel Nonlinear Optical Polyurethane Polymer," European Polymer Journal (2001), 37(3), 445-449.
Kannan, Ramamurthi et al., "Toward Highly Active Two-Photon Absorbing Liquids: Synthesis and Characterization of 1,3,5-Triazine-Based Octupolar Molecules," Chemistry of Materials (2004), 16(1), 185-194.
Kannan, Ramamurthi et al., "Diphenylaminofluorene-Based Two-Photon-Absorbing Chromophores with Various-Electron Acceptors," Chemistry of Materials (2001), 13 (5), 1896-1904.
J. R. Smith et al., "Space durable polymer/carbon nanotube films for electrostatic charge mitigation," Polym., vol. 45 (2004) 825-836.
H. Kong et al., "Controlled functionalization of multiwalled carbon nanotubes by in situ atom transfer radical polymerization," JACS., vol. 126 (2004) 412-413.
J-B Baek et al., "Improved syntheses of poly(oxy-1,3-phenylenecarbonyl-1,4-phenylene) and related poly(ether ketones) using polyphosphoric acid/P205 as polymerization medium," Polym., vol. 44 (2003) 4135-4147.
J. L. Bahr et al., "Covalent chemistry of single-wall carbon nanotubes," J. Mater. Chem., vol. 12 (2002) 1952-1958.
K. A. Watson et al., "Polyimide/carbon nanotube composite films for potential space applications," Sampe Technical Conf., vol. 33 (2001) 1551-1560.
B. Maruyama et al., "Carbon nanotubes and nanofibers in composite materials," SAMPE J., vol. 38 (2002), pp. 59-70, 11 pages total.
M.S.P. Shaffer, "Polystyrene grafted multi-walled carbon nanotubes," Chem. Comm. (2002) 2074-2075.
C. Park et al., "Dispersion of single wall carbon nanotubes by in situ polymerization under sonication," Chem. Phys. Lett., vol. 364 (2002) 303-308.

(Continued)

Primary Examiner — Randy Gulakowski
Assistant Examiner — Jeffrey Washville
(74) Attorney, Agent, or Firm — AFMCLO/JAZ; Rebecca Greendyke

(57) ABSTRACT

Two-photon absorbing (2PA), cross-linked polyurethanes were prepared from bis(isocyanato) monomers, tris(isocyanato) monomers or a mixture thereof, in conjunction with novel polyol molecules with donor-acceptor octupolar geometry, whose generic structure is comprised of an electron-accepting 1,3,5-triazine hub with three spokes constituted by electron-donating triarylalkylamine end-groups, which are polyfunctionalized with thermally reactive alcohol functions. The resulting neat glassy or rubbery solids are applicable in a wide range of linear and nonlinear optical applications.

17 Claims, 2 Drawing Sheets

(56) References Cited

OTHER PUBLICATIONS

N. Tagmatarchis et al., "Sidewall functionalization of single-walled carbon nanotubes through electrophilic addition," Chem. Comm. (2002) 2010-2011.

Y. Iwakura et al., "Syntheses of aromatic polyketones and aromatic polyamide" J. Polym. Sci., vol. 6 (1968) 3345-3355.

United States Patent and Trademark Office, Non-Final Office Action in U.S. Appl. No. 10/963,469, mailed Sep. 26, 2007, 7 pages total.

United States Patent and Trademark Office, Final Office Action in U.S. Appl. No. 10/963,469, mailed Apr. 8, 2008, 9 pages total.

United States Patent and Trademark Office, Advisory Action in U.S. Appl. No. 10/963,469, mailed Jul. 2, 2008, 6 pages total.

United States Patent and Trademark Office, Non-Final Office Action in U.S. Appl. No. 13/239,606, mailed Mar. 28, 2013, 8 pages total.

J-B. Baek et al., "Covalent modification of vapour-grown carbon nanofibers via direct Friedel-Crafts acylation in polyphosphoric acid," J. Mater. Chem., vol. 14 (2004) 2052-2056.

H. Peng et al., "Green and highly efficient functionalization of carbon nanotubes by combination of 1,3-dipolar cycloaddition and Curtius rearrangement reactions," Chinese J. Chem., vol. 28 (2010) 1223-1228.

L-S. Tan et al., Unpublished U.S. Appl. No. 10/963,469, filed Oct. 12, 2004, 15 pages total.

United States Patent and Trademark Office, Non-Final Office Action in U.S. Appl. No. 14/047,460, mailed Dec. 16, 2013, 13 pages total.

* cited by examiner

TWO-PHOTON ABSORBING CROSS-LINKED POLYURETHANES CONTAINING DIPHENYLAMINO-DIALKYLFLUORENE-1,3,5-TRIAZINE UNITS

CROSS-REFERENCE TO RELATED APPLICATIONS

This application is a continuation-in-part of, and claims priority from, co-pending U.S. patent application Ser. No. 13/237,078, filed on Sep. 20, 2011, by inventor Loon-Seng Tan et al., and entitled "Two-Photon Absorbing Cross-Linked Polyurethanes Containing Diphenylamino-Dialkylfluorene-1,3,5-Triazine Units," which is incorporated herein by reference in its entirety.

RIGHTS OF THE GOVERNMENT

The invention described herein may be manufactured and used by or for the Government of the United States for all governmental purposes without the payment of any royalty.

BACKGROUND OF THE INVENTION

The present invention relates to cross-linked or network polymers containing covalently bound chromophores with large, effective two-photon absorption cross-sections in the near-infrared spectral region and good linear transmission in the visible region.

Two-photon or multiphoton absorption occurs through the simultaneous absorption of two or more photons via virtual states in an absorbing medium, with the former being more common. For a given chromophore, these absorption processes take place at wavelengths much longer than the cut-off wavelength of its linear (one-photon) absorption. In the case of two-photon absorption (2PA), two quanta of photons may be absorbed from a single light source (degenerate 2PA) or two sources of different wavelengths (non-degenerate 2PA). Although multiphoton absorption processes have been theoretically described in 1931 and experimentally confirmed about 30 years later, this field remained dormant largely due to the lack of materials with sufficiently large two-photon sensitivity, quantified as two-photon cross-section ($\sigma_2'$), which is usually expressed in the units of Göppert-Mayer (1 GM=$10^{-50}$ cm$^4$-sec/photon-molecule).

Then, in the mid-1990s, several new classes of chromophores exhibiting very large effective $\sigma_2'$ values were reported. In conjunction with the increased availability of ultrafast high-intensity lasers, the renewed interest has sparked not only a flurry of activities in the preparation of novel dye molecules with enhanced $\sigma_2'$ values, but also advancement of many previously conceived applications based on 2PA process in photonics and biophotonics, which are now enabled by these new chromophores. It is important to recognize the following useful features of the 2PA phenomenon based on the fact that 2PA scales nonlinearly with the squared intensity of the incident laser beam: (a) upconverted emission, whereby an incident light at lower frequency (energy) can be converted to an output light at higher frequency, for instance, near infrared (NIR) to ultraviolet (UV) upconversion; (b) deeper penetration of incident NIR light (into tissue samples, for example) than UV light that may also be hazardous with prolonged exposure; (c) highly localized excitation as compared with one-photon processes, allowing for precise spatial control of in situ photochemical or photophysical events in the absorbing medium, thereby minimizing undesirable activities such as photodegradation or photobleaching; and (d) fluorescence, when properly manipulated, that would allow for information/signal feedback or amplification in conjunction with other possible, built-in effects such as surface plasmonic enhancement.

It is anticipated that further ingenious utilization of these basic characteristics will lead to practical applications other than the ones that have already emerged in such diverse areas as biomedical fluorescence imaging, data storage, protection against accidental laser damage, microfabrication of microelectromechanical systems (MEMS), photodynamic therapy, etc. In the past decade or so, significant advances have been made in the fundamental understanding of general structure-property relationships that have led to the design and synthesis of two-photon absorbers with very large cross-section values. Although further enhancement of 2PA cross-section is still possible as suggested by a number of theoretical studies, for certain applications, the two-photon-property requirement has essentially been met by the state-of-art chromophores. Because of the possible property-processing/fabrication tradeoff, the secondary properties, e.g. thermal and mechanical properties, that are important to material processing into various useful forms (films, coatings, fibers, windows etc.) and configurations should be addressed. For the aforementioned solid forms, polymers may offer many advantages such as the flexibility in fine-tuning the material properties and the availability of many processing options.

Polyurethanes are one of the most versatile commodity polymers that are found in general applications such as coatings, adhesives, composite matrices, shape memory polymers, etc. They are best known to the general public in the form of flexible foams that can be found in upholstery, mattresses, earplugs, and packaging, as well as rigid foams in the insulation for buildings, water heaters, refrigerated transport, and commercial and residential storage refrigeration. In more advanced applications, polyurethanes have been shown to be promising as matrix polymers for electro-optical devices (see, e.g., D. S. Won et al., Polymer International, 2010; 59:162-168) and two-photon lithography (see, e.g., A. Ambrosio et al., Applied Physics Letters, 2009; 94, 011115).

Polyurethanes are typically formed under anhydrous conditions by reacting a polyol (an alcohol with more than two reactive hydroxyl groups per molecule, A(OH)$_x$, where x=2, 3,4,5,6.) with a diisocyanate or a polymeric isocyanate (B(NCO)$_y$, where y=2,3,4,5,6.) under the influence of heat and/or in the presence of suitable catalysts and additives. Linear polyurethanes are typically produced from the generic reaction of A(OH)$_2$ and B(NCO)$_2$. Cross-linked or network polyurethanes are generated from the various combinations of A(OH)$_x$+B(NCO)$_y$, where either x or y or both are greater than 2. For advanced optical applications where two-photon properties are required, a practical advantage of using polyurethane as a matrix polymer is that a good selection of the polyol and polyisocyanate monomers, which may be cured to form glass-like clear films, lenses, and windows, are readily available in large quantities and at low cost. An attractive feature of the cross-linked polyurethanes is the possibility of tailoring the processing and fabrication conditions to be solventless and to be compliant with green manufacturing practices.

Accordingly, it is an object of the present invention to provide two-photon active thermosetting polymers that: (i) are generated from thermally reactive, multifunctional monomers under practically solventless conditions; (ii) are comprised of network structure at the molecular level, leading to amorphous and visually transparent solids; and (iii) contain in their repeat units the essential components such as electron-donating triarylamine and electron-accepting 1,3,5-triazine moieties, as well as conjugated bridges such as 2,7-fluorenyl, para-phenylene, and related para-phenylenevinylene, when in combination, are known for their high 2PA response.

A specific object is to provide 2PA solid materials prepared from solventless thermal polymerization of a novel polyhydroxylated AFX chromophores with commercially available organic bis(isocyanato) and tris(isocyanato) monomers resulting in 2PA-active, cross-linked polyurethane boules containing chromophores with the structural motif in which a 1,3,5-triazine core is triply connected to tertiary amino end-groups via 9,9-dialkyfluorenyl bridges.

Other objects and advantages of the invention will be set forth in part in the description that follows, and in part will be obvious from the description, or may be learned by practice of the invention. The objects and advantages of the invention may be realized and attained by means of the instrumentalities and combinations particularly pointed out in the appended claims.

SUMMARY OF THE INVENTION

In accordance with the present invention, there are provided new 2PA-active, cross-linked polyurethanes derived from the polymerization of (i) a difunctional isocyanato monomer, (ii) a trifunctional isocyanato monomer, or (iii) a mixture thereof; and a polyhydroxy tris(diarylamino-9,9-dialkylfluorenyl)-1,3,5-triazine with the following structure:

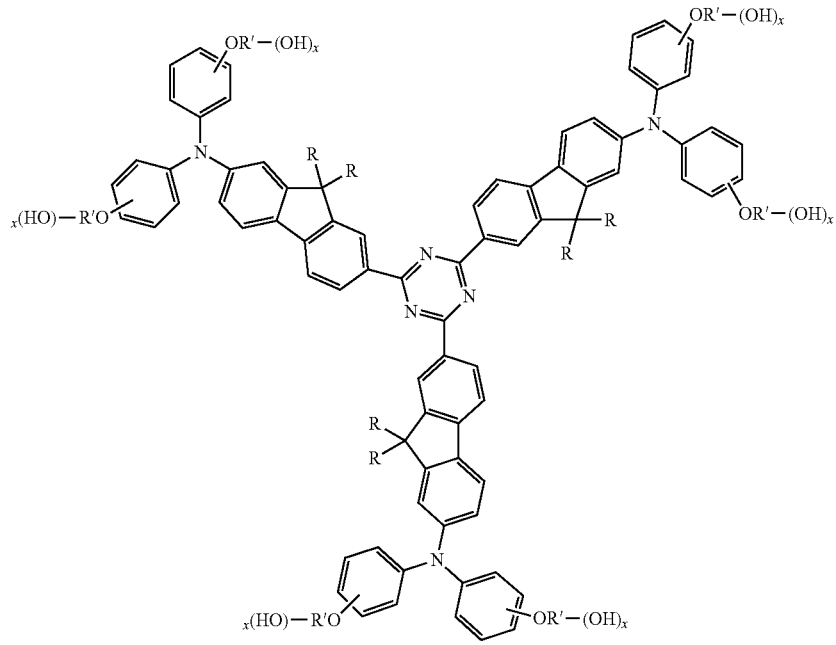

R may be a linear or branched alkyl group or an alkylether group, and R' is a linear or branched alkyl group. The OR'—(OH) groups are located in a meta or para position with respect to the triarylamine nitrogen, and x may be from 1 to 3.

In one embodiment, cross-linked polyurethanes according to the present invention have the following structure in which x may be from 1-3 and y may be 2 or 3:

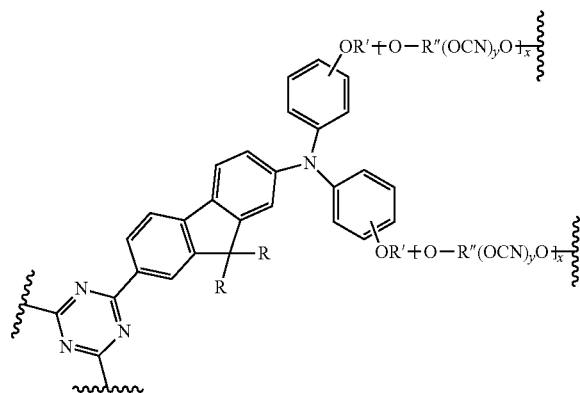

The difunctional isocyanato monomer [R"(OCN)$_2$] is selected from the group in which R" consists of methylene-1,1'-di(4-phenyl)-; toluene-2,5-(difunctionalized)-; 1,3,3-trimethyl-5-(functionalized)-cyclohexylmethylene-; α,ω-(CH$_2$)m-, wherein m is from 4 to 12; and methylene-1,1'-di(4-cyclohexyl)-. The trifunctional isocyanato monomer [R"(OCN)$_3$] is selected from the group in which R" consists of 4,4',4"-(trifunctionalized)-triphenylthiophosphate; 4,4',4"-(trifunctionalized)-triphenylmethane; isocyanurate-N,N',N"-tris-4-(2-toluenyl)-; propane-3,3,3-tris-(4-iminecarbonyloxymethyl-2-toluenyl)-; isocyanurate-N,N',N"-tri-ω-alkyl-; and biuret-N,N',N"-tri-ω-alkyl-.

In one embodiment, the difunctional isocyanato monomer may comprise diphenylmethane-4,4'-diisocyanate; toluene-2,5-diisocyanate; isophorone diisocyanate; 1,6-hexamethylene; bis(4-isocyanatocyclohexyl)methane; and/or bis(4-isocyanatocyclohexyl)methane. The difunctional isocyanato monomer(s) react with the polyhydroxy tris(diarylamino-9,9-dialkylfluorenyl)-1,3,5-triazine in the equivalent molar ratio range of NCO (isocyanate):OH (hydroxyl) from 0.9:1.0 to 0.9:1.10.

In a further embodiment, the trifunctional isocyanato monomer may comprise N,N',N"-tris(6-isocyanatohexamethylene)biuret; 2,4,6-tris(6-isocyanatohexamethylene)isocyanurate; tris(p-isocyanatophenyl)thiophosphate; 3,3,3-tris-[4(2-isocyanatotoluenyl)iminecarbonyloxymethyl]-propane; tris(4-isocyanatophenyl)methane; and/or N,N',N"-tris-4(2-isocyanatotoluenyl)isocyanurate. The trifunctional isocyanato monomer(s) react with the polyhydroxy tris(diarylamino-9,9-dialkylfluorenyl)-1,3,5-triazine in the equivalent molar ratio range of NCO (isocyanate):OH (hydroxyl) from 0.9:1.0 to 0.9:1.10.

In an alternative embodiment, the 2PA-active, cross-linked polyurethanes according to the present invention are derived from the polymerization of (i) a difunctional isocyanato monomer, (ii) a trifunctional isocyanato monomer, or (iii) a mixture thereof; and a polyhydroxy tris(diarylamino-9,9-dialkylfluorenyl)-1,3,5-triazine having the following structure:

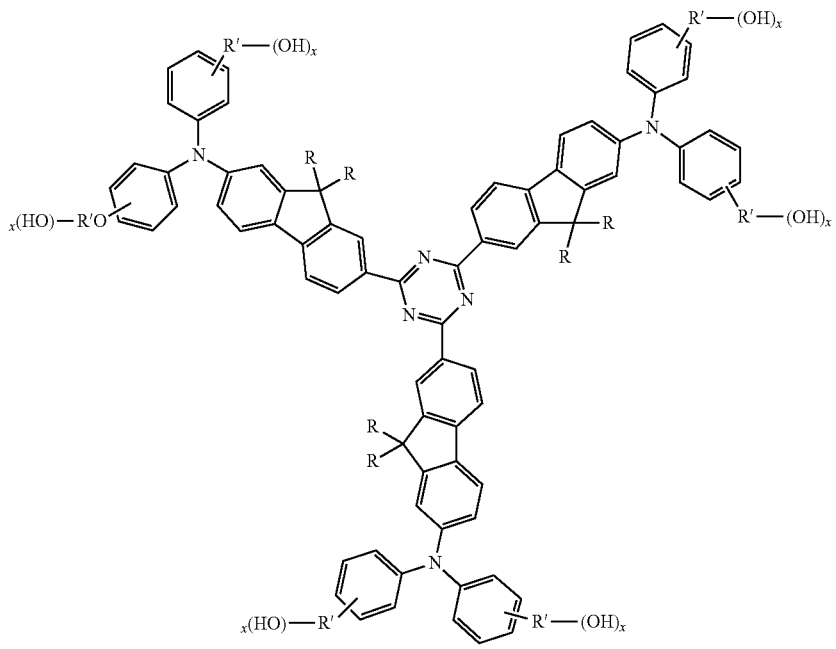

R may be a linear or branched alkyl group or an alkylether group, and R' may be a linear or branched alkyl group. The R'—(OH)$_x$ groups may be located in a meta or para position with respect to the triarylamine nitrogen, and x may be from 1 to 3.

In another embodiment, cross-linked polyurethanes according to the present invention have the following structure in which x may be from 1-3 and y may be 2 or 3:

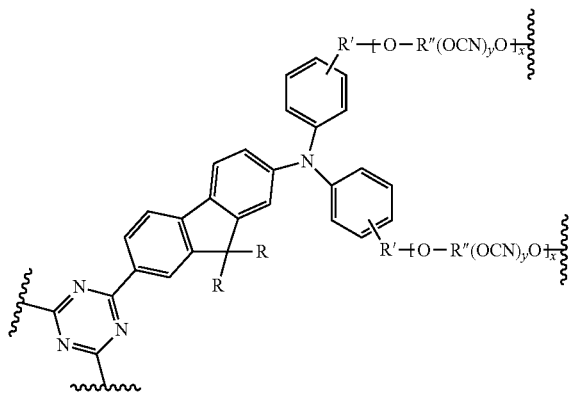

The difunctional isocyanato monomer [R"(OCN)$_2$] is selected from the group in which R" consists of methylene-1,1'-di(4-phenyl)-; toluene-2,5-(difunctionalized)-; 1,3,3-trimethyl-5-(functionalized)-cyclohexylmethylene-; α,ω-(CH$_2$)m-, wherein m is from 4 to 12; and methylene-1,1'-di(4-cyclohexyl)-. The trifunctional isocyanato monomer [R"(OCN)$_3$] is selected from the group in which R" consists of 4,4',4"-(trifunctionalized)-triphenylthiophosphate; 4,4',4"-(trifunctionalized)-triphenylmethane; isocyanurate-N,N',N"-tris-4-(2-toluenyl)-; propane-3,3,3-tris-(4-iminecarbonyloxymethyl-2-toluenyl)-; isocyanurate-N,N',N"-tri-ω-alkyl-; and biuret-N,N',N"-tri-ω-alkyl-. The two-photon active cross-linked polyurethane compositions according to the present invention comprise a combination of at least one difunctional isocyanato monomer and at least one trifunctional isocyanato monomer, which react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10. The difunctional isocyanato monomer is selected from the group consisting of diphenylmethane-4,4'-diisocyanate; toluene-2,5-diisocyanate; isophorone diisocyanate; 1,6-hexamethylene diisocyanate; bis(4-isocyanatocyclohexyl)methane; and bis(4-isocyanatocyclohexyl)methane. The trifunctional isocyanato monomer is selected from the group consisting of N,N',N"-tris(6-isocyanatohexamethylene)biuret; 2,4,6-tris(6-isocyanatohexamethylene)isocyanurate; tris(p-isocyanatophenyl)thiophosphate; 3,3,3-tris-[4(2-isocyanatotoluenyl)iminecarbonyloxymethyl]-propane; tris(4-isocyanatophenyl)methane; and N,N',N"-tris-4(2-isocyanatotoluenyl)isocyanurate.

DETAILED DESCRIPTION OF INVENTION

In one embodiment, the subject polyhydroxy 1,3,5-triazine-based AFX chromophores (generically identified as AF-452-XOH) is shown below:

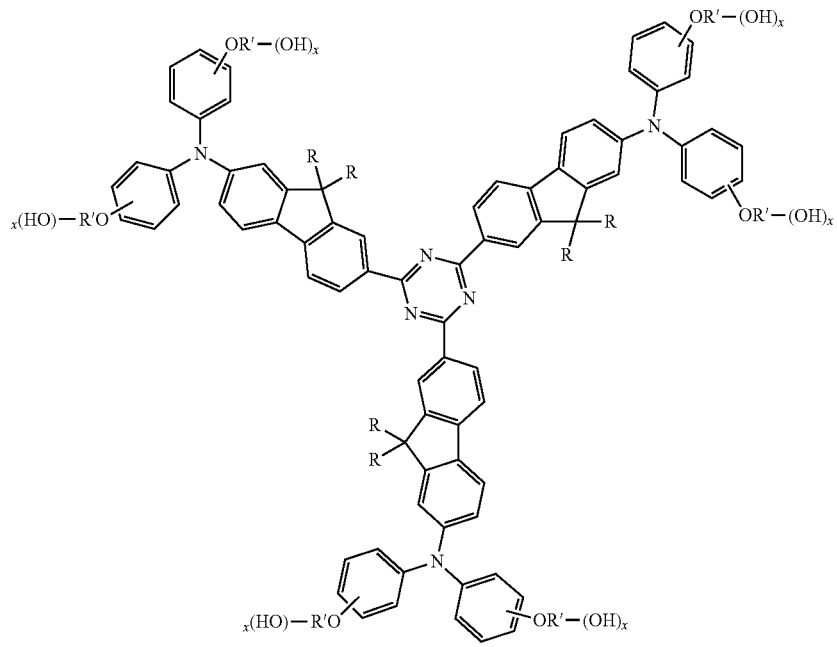

In another embodiment, the polyhydroxy 1,3,5-triazine-based AFX chromophore has the following structure:

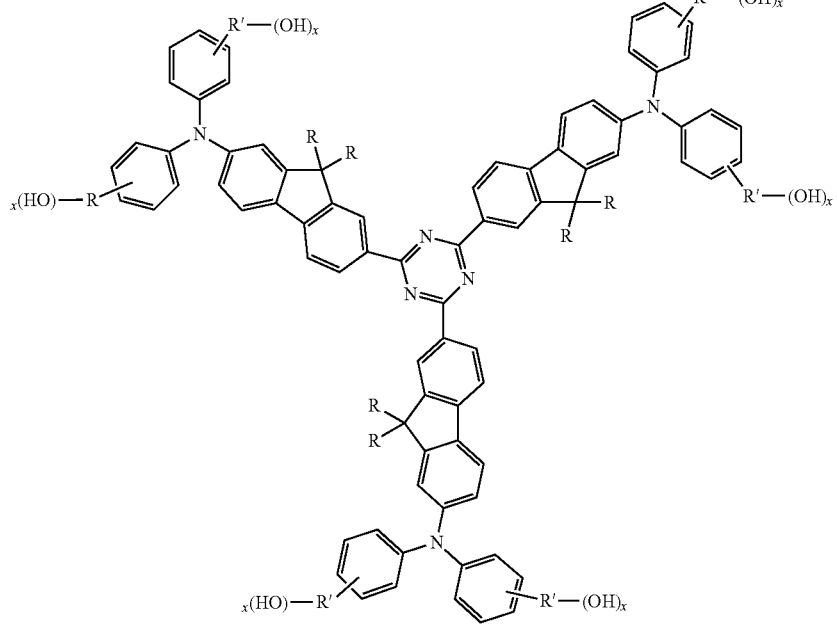

In both embodiments, R may be a linear or branched alkyl group or an alkylether group. For example, R may comprise an alkyl group with the formula —$C_mH_{2m+1}$, where m is from 1 to 6 in one embodiment, or an alkylether group with the formula —$(CH_2CH_2O)_p$Me, where p is from 1 to 5 in one embodiment. R' may be a linear or branched alkyl group. The OR'—(OH)$_x$ and R'—(OH)$_x$ groups may be located in a meta or pars position with respect to the triarylamine nitrogen, and x may be from 1 to 3. In the exemplary embodiments depicted above, the molecules contain six OR'—(OH)$_x$ or R'—(OH)$_x$ groups. The total number of OR'—(OH)$_x$, and R'—(OH)$_x$ groups may be 3 or 6 per molecule, and depending on manufacturing conditions, mixtures of molecules may contain differing numbers of OR'—(OH)$_x$ or R'—(OH)$_x$ groups per molecule.

Figure 1:
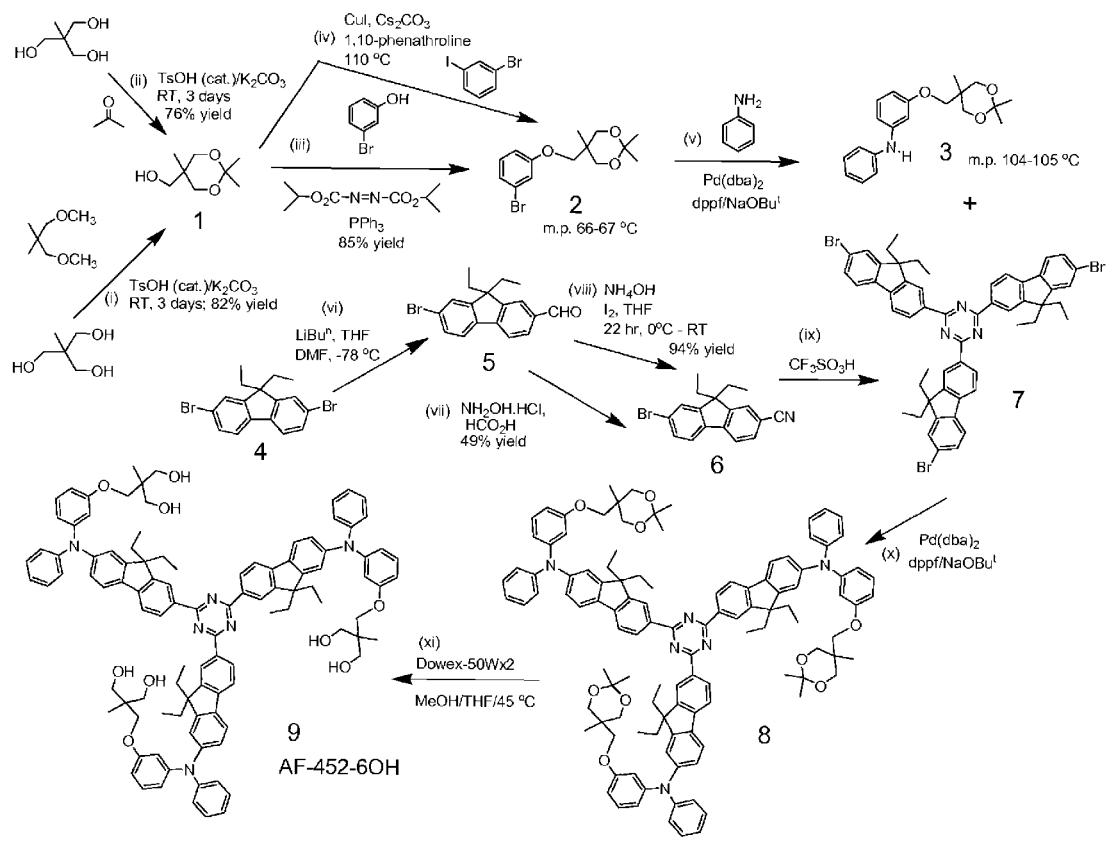
FIG. 1 illustrates an exemplary method of synthesizing 2,4,6-Tris {7-[3-(2,2-di(hydroxymethyl)-propyloxy)]diphenylamino]-9,9-diethylfluoren-2-yl)}-1,3,5-triazine (AF-452-6OH).

As an illustration, a hexahydroxy 1,3,5-triazine-based AF-450 derivative (U.S. Pat. No. 6,555,682) designated as AF-452-6OH was synthesized following the synthetic scheme shown in FIG. 1 and briefly described by the following. The convergent synthesis of AF-452-6OH (compound 9 in FIG. 1) was accomplished in two parallel sequences followed by a converging sequence: (i) a four-step sequence to the protected 3-O-alkylated diphenylamine intermediate, (ii) a three-step sequence to the tris(7-bromofluorene)triazine intermediate (7); and (iii) a two-step sequence to AF-452-6OH (8). Briefly, the first sequence was started with tris-1,1,1-(hydroxymethyl)ethane, which was first protected as an acetonide derivative, i.e. 2,2,5-trimethyl-5-hydroxymethyl-1,3-dioxane (1) in either reaction as indicated in FIG. 1, as reactions (i) or (ii). A Mitsunobu reaction of (1) with 3-bromophenol furnished the corresponding bromophenoxy-methyltrimethyl-1,3-dioxane (2) in 85% yield [FIG. 1, reaction (iii)]. The same compound could also be obtained in 59% yield from a copper-catalyzed reaction between 3-bromoiodobenzene and (1) [FIG. 1, reaction (iv)]. Compound (2) was aminated with aniline to produce the diphenylamine intermediate (3) [FIG. 1, reaction (v)]. In the second sequence, 2,7-dibromo-9,9-diethylfluorene (4) was first monoformylated to form 7-bromodiethylfluorene-2-aldehyde (5), which was then converted to the nitrile intermediate (6) in 93% yield [FIG. 1, reactions (vi) and (viii), respectively]. A less satisfactory conversion of the aldehyde intermediate (5) to the nitrile intermediate (6) via a hydroxylimine intermediate was also conducted [49% yield, FIG. 1, reaction (vii)]. The nitrile intermediate (6) was subsequently and catalytically trimerized in trifluoromethanesulfonic acid to afford the tribromo-1,3,5-triazine intermediate (7) in 95% yield [FIG. 1, reaction (ix)]. Covalently joining the triazine component (7) with the diphenylamine component (3) with the assistance of a Pd-catalyzed amination gave the precursor chromophore protected as an acetonide (8) [FIG. 1, reaction (x)]. Removal of the acetone protecting groups from (8) was accomplished by mixing and stirring (8) together with Dowex®-50WX2 (The Dow Chemical Company) (acid-form) resin, and the desired product, AF-452-6OH (9), was obtained in 90% yield [FIG. 1, reaction (xi)]. AF-452-6OH (9), which contains three sets of 1,3-diols, is expected to react with a wide range of industrially useful electrophiles such as those containing carbonyl (i.e. ketone, aldehyde, carboxylic acid, anhydride, or acid halide), isocyanate, and halosilyl groups.

The crosslinked polyurethane compositions and optically clear solids according to the present invention may be prepared by co-reacting AF-452-XOH with a difunctional isocyanato monomer, a trifunctional isocyanato monomer, or a mixture of both in the equivalent ratios of NCO (isocyanate):OH (hydroxyl), ranging from 0.9:1:0 to 1.20:1.0, preferably, in the molar-ratio range of 1:05:1.0 to 1.10:1.0 for trifunctional isocyanato monomers with high aliphatic content.

In one embodiment, the crosslinked polyurethane according to the present invention has the following structure (only one branch of the polyurethane composition is depicted):

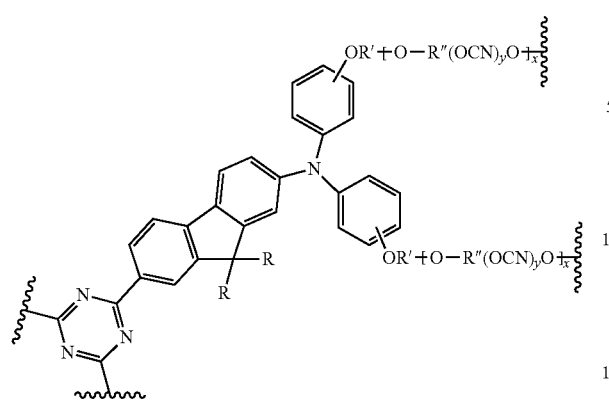

In another embodiment, the crosslinked polyurethane according to the present invention has the following structure (only one branch of the polyurethane composition is depicted):

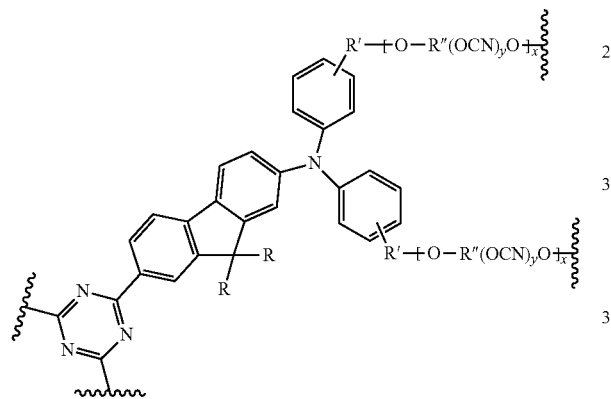

In both embodiments of the crosslinked polyurethane depicted above, x may be from 1 to 3 and y may be 2 or 3. Where y=2, the difunctional isocyanato monomer [R"(OCN)$_2$] is selected from the group wherein R" consists of methylene-1,1'-di(4-phenyl)-; toluene-2,5-(difunctionalized)-; 1,3,3-trimethyl-5-(functionalized)-cyclohexylmethylene-; α,ω-(CH$_2$)m-, wherein m is from 4 to 12; and methylene-1,1'-di(4-cyclohexyl)-. Where y=3, the trifunctional isocyanato monomer [R"(OCN)$_3$] is selected from the group wherein R" consists of 4,4',4"-(trifunctionalized)-triphenylthiophosphate; 4,4',4"-(trifunctionalized)-triphenylmethane; isocyanurate-N,N',N"-tris-4-(2-toluenyl)-; propane-3,3,3-tris-(4-iminecarbonyloxymethyl-2-toluenyl)-; isocyanurate-N,N',N"-tri-ω-alkyl-; and biuret-N,N',N"-tri-ω-alkyl-. The difunctional isocyanato monomer may include, but is not limited to, diphenylmethane-4,4'-diisocyanate; toluene-2,5-diisocyanate; isophorone diisocyanate; 1,6-hexamethylene diisocyanate; bis(4-isocyanatocyclohexyl)methane; and bis(4-isocyanatocyclohexyl)methane. The trifunctional isocyanato monomer may include, but is not limited to, N,N',N"-tris(6-isocyanatohexamethylene)biuret; 2,4,6-tris(6-isocyanatohexamethylene)isocyanurate; tris(p-isocyanatophenyl)thiophosphate; 3,3,3-tris-[4(2-isocyanatotoluenyl)iminecarbonyloxymethyl]-propane; tris(4-isocyanatophenyl)methane; and N,N',N"-tris-4(2-isocyanatotoluenyl)isocyanurate. Examples of difunctional and trifunctional isocyanato monomers are depicted below in Schemes 1 and 2.

Figure 2:
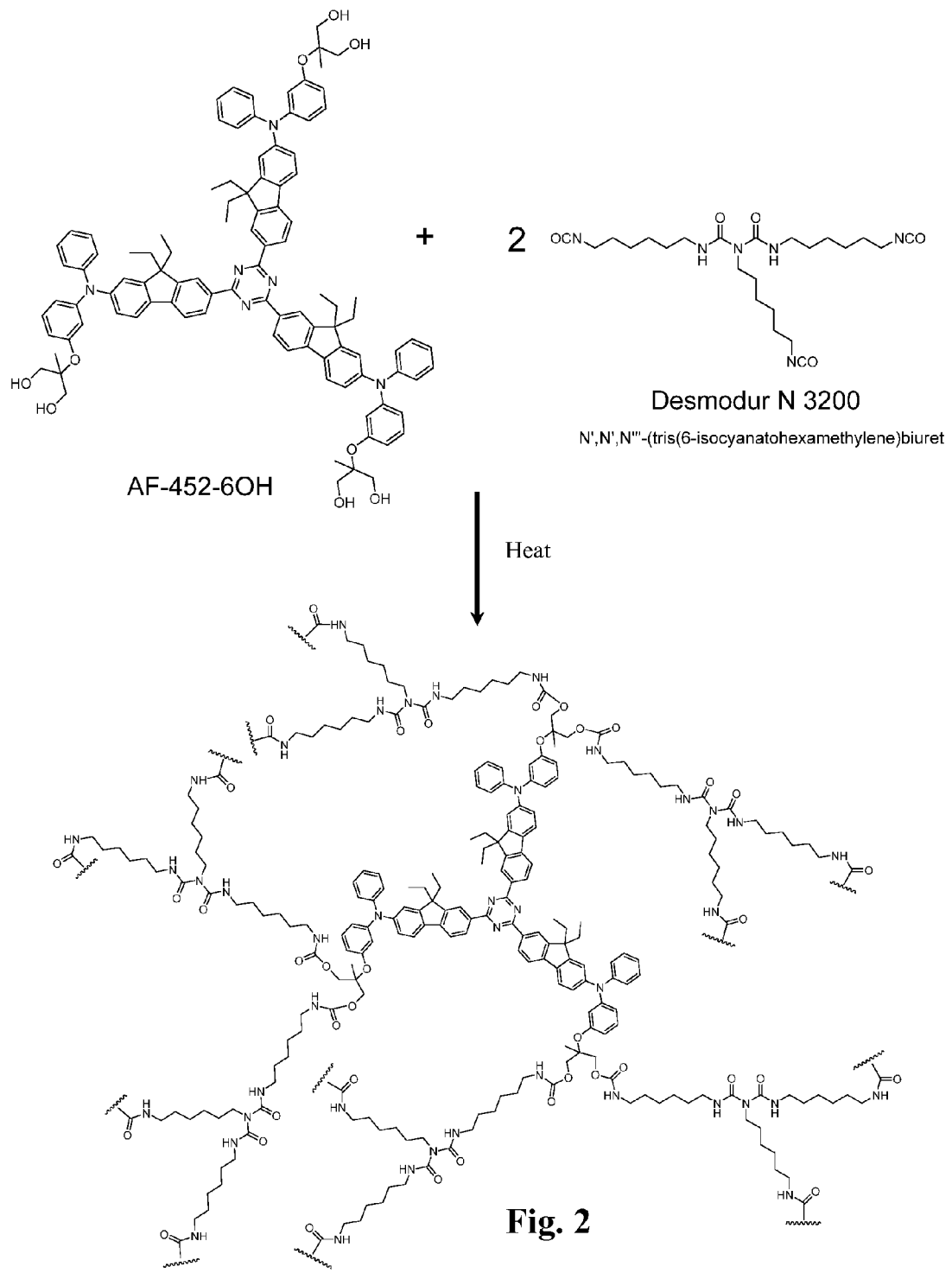
FIG. 2 illustrates an exemplary method of thermal polymerization of AF-452-6OH with a trifunctional isocyanato monomer to form a cross-linked polyurethane solid.

An exemplary method for obtaining a crosslinked polyurethane according to the present invention is outlined in FIG. 2. AF-452-6OH is reacted with a trifunctional isocyanato monomer, N,N',N"-tris(6-isocyanatohexamethylene)biuret (Desmodurr® N 3200) (Bayer MaterialScience). The resulting idealized molecular structure shows the two-photon active AF-452 unit forming urethane (carbamate) linkages with six biuret-containing chains. This structure may be considered as the basic (recurring) unit in the polymer structure of the cross-linked polyurethane solid.

Scheme 1: Difunctional Isocyanato Monomers for AF-452-XOH-Based

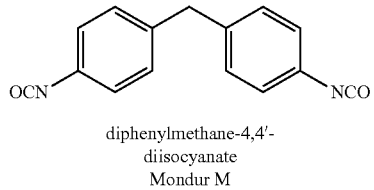

diphenylmethane-4,4'-diisocyanate
Mondur M

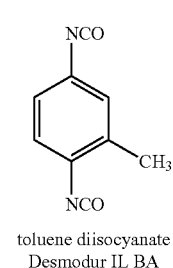

toluene diisocyanate
Desmodur IL BA

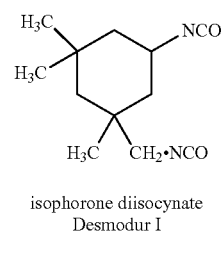

isophorone diisocynate
Desmodur I

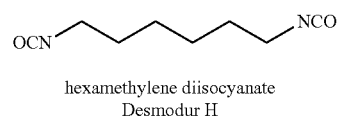

hexamethylene diisocyanate
Desmodur H

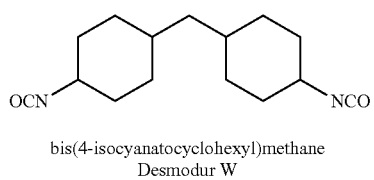

bis(4-isocyanatocyclohexyl)methane
Desmodur W

Scheme 2: Trifunctional Isocyanato Monomers for AF-452-XOH-Based

I
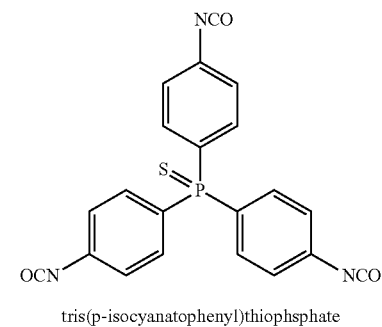
tris(p-isocyanatophenyl)thiophsphate

II
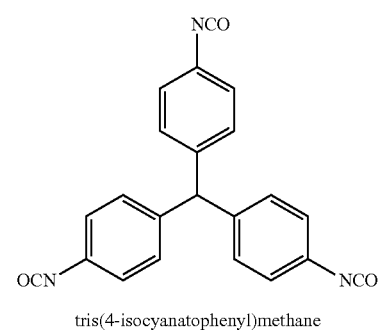
tris(4-isocyanatophenyl)methane

III
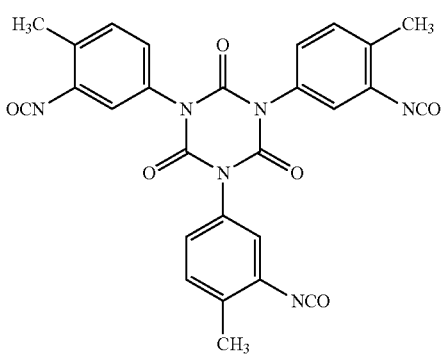
N,N',N''-tris-4(2-isoxyanatotoluenyl)isocyanurate

IV
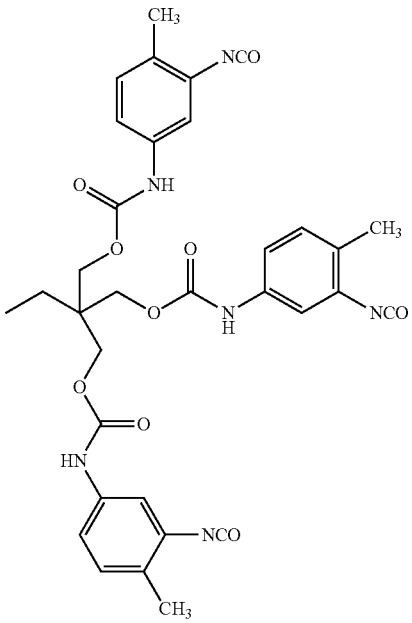
3,3,3-tris-[4(2-isocyanatotoluenyl)iminecarbonyloxymethyl]-propane V
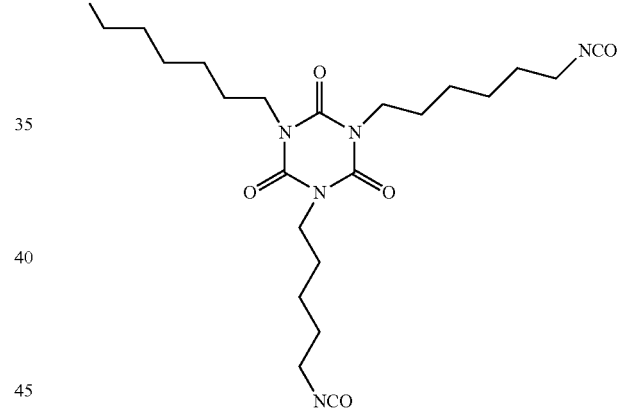
N,N',N''-tris(6-isocyanatohexamethylene)isocyanurate VI
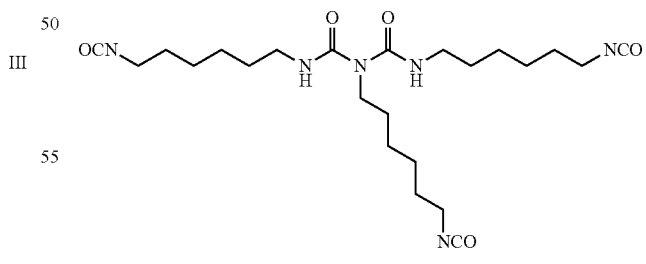
N,N',N''-tris(6-isocyanatohexamethylene)biuret In addition, diol compounds such as 1,4-butanediol, 1,6-hexanediol or 2,2-bis(4-phenol)-1,1,1,3,3,3-hexafluoropropane (6F-BPA) may optionally be added as a co-monomer to tailor the mechanical and optical properties of the cross-linked polyurethane compositions and solids. A catalyst such as 1,4-diazabicyclo[2.2.2]octane (DABCO) and dibutyltin dilaurate may also be added to accelerate the rate of thermal curing.

The linear optical and two photon properties for the dyes according to the present invention are expected to be similar to those of related AFX chromophores, namely AF-450, AF-455, and AF-457 described in U.S. Pat. No. 6,555,682. The effective 2PA cross-sections ($\sigma_2'$, 1 GM=$10^{-50}$ cm$^4$-sec/photon-molecule; ±15% uncertainty) of these AFX chromophores were measured by a nonlinear transmission (NLT) technique in THF solution (0.02 M) at 800 nm with ~8 ns laser pulses and found to be in the range of 28,000-40,000 GM. The two-photon spectra of these AFX chromophores have also been determined by a femtosecond, degenerate white-light continuum technique in THF from 600-900 nm with the peak values for the intrinsic 2PA cross-section found in the range of 200-220 GM at 779 nm.

The polyurethanes of this invention may be synthesized following the procedures given in the following Examples, which illustrate the invention:

Example 1

Synthesis of 2,7-Dibromofluorene

Bromine (74 ml, 1.44 mol) diluted with methylene chloride (100 ml) was added drop-wise over a period of 1.5 hours to a mechanically stirred mixture of fluorene (113.76 g, 0.68 mol), iodine (1.96 g, 0.0077 mol), and methylene chloride (750 ml) at room temperature. After 5 minutes, a solution of sodium bisulfite (15.0 g) in water (100 ml) was added, and the mixture was stirred for 30 minutes, at which point the mixture became colorless. Water (750 ml) was then added, and the methylene chloride was distilled off. The product slurry was filtered, and the product was air-dried, 220.5 g, m.p. 151 (sh), 156-160° C. This material was used in the next step without further purification.

Example 2

Synthesis of 2,7-Dibromo-9,9-diethylfluorene

To a mechanically stirred mixture of 2,7-dibromofluorene (66.5 g, 0.205 mol), powdered potassium hydroxide (56.0 g, 1.0 mol), potassium iodide (3.4 g) and DMSO (150 ml), cooled to 10° C., ethyl bromide (40 ml, 58.4 g, 0.536 mol) was added drop-wise over 45 minutes. The mixture turned from red to light purple. After allowing the temperature to warm to 20° C., the mixture was left overnight to stir and was then poured into water, 77.0 g (98.7% yield), m.p. 144-153° C. The product was recrystallized from hexane (550 ml) with charcoal treatment and collected in two crops, m.p. 154-157° C. and 153-154° C., totaling 60.36 g (77.4% yield).

Example 3

Synthesis of 7-Bromo-9,9-diethyl-fluorene-2-carboxaldehyde

To a mechanically stirred solution of 9,9-diethyl-2,7-dibromofluorene (59.38 g, 0.1563 mol) in THF (325 ml) cooled in a dry ice-ethanol bath, n-butyl lithium (104 ml of 1.6 M solution in hexanes, 0.1664 mol, 1.06 eq.) was added drop-wise over 25 minutes. After 20 minutes, DMF (17 ml, 0.22 mol) in THF (30 ml) was added, and the mixture was stirred in the cooling bath for 1.5 hours and outside the bath for 1 hour. The reaction was then cooled to 5° C. and treated with hydrochloric acid (12.5 ml of concentrated hydrochloric acid diluted with 50 ml water). The mixture was diluted with 200 ml of toluene, and the aqueous phase was separated and extracted with 200 ml of toluene. The combined organic phase was washed with dilute sodium bicarbonate solution, dried over magnesium sulfate, and concentrated. The residual solids were recrystallized from heptane-ethyl acetate (9:1) to obtain colorless solids, 40.29 g (78.4% yield) m.p. 126-128° C. The mother liquor, after chromatography over 150 g silica gel, elution with 1:1 heptane-toluene, and trituration of residual solids in hexanes, gave additional product, 6.56 g (12.8% yield, total 91% yield), m.p. 126-128° C. Mass Spec: m/z 328, 330, (M$^+$). A sample for analysis was prepared by recrystallization from hexanes, m.p. 127-129° C. Analysis: Calculated for $C_{18}H_{17}BrO$, C, 65.55, H, 5.20, and Br 24.27%. Found, C, 65.60, H, 5.51, and Br 24.71%.

Example 4

Synthesis of 7-Bromo-9,9-diethylfluorene-2-carbonitrile

Iodine (16.0 g, 60.0 mmol) was added in portions to a mechanically stirred mixture of 7-bromofluorene-9,9-diethyl-2-carboxaldehyde (32.0 g, 97.2 mmol), THF (400 ml), 28% ammonium hydroxide solution (800 ml) cooled to 5° C. The mixture was then allowed to warm to room temperature. After 5 hours, the mixture was cooled, a second portion of iodine (16.0 g, 60.0 mmol) was added, and the stirring was continued for 18 hours. Toluene (600 ml) was added, and the organic phase was washed with water, dried, and concentrated. The residue was dissolved in hot hexanes (75 ml) and cooled. The crystalline nitrile product that separated upon cooling was collected, 29.88 g (94% yield), m.p. 87-89° C. Mass spec: m/z 325, 327 (M$^+$).

An alternate, but less satisfactory synthesis was conducted as follows: A mixture of 7-bromo-9,9-diethylfluorene-2-carboxaldehyde (3.29 g, 10.0 mmol), hydroxylamine hydrochloride (0.9 g, 10.0 mmol), and formic acid (15 ml) was held at reflux for 2 hours, cooled, and filtered. The filtrate was worked up by extraction into toluene, washing the extract with water and bicarbonate solution, drying, and concentrating. The residue was combined with the formic acid-insoluble solids and chromatographed over silica gel. Obtained were the desired nitrile product, 1.58 g (49%), m.p. 85-87° C., mass spec (m/z): 325, 327 (M$^+$); the amide byproduct, 0.42 g (12%), m.p. 179-184° C., mass spec (m/z): 343, 345 (M$^+$); and the oxime byproduct, m.p. 104-107° C., 0.17 g (5%), mass spec (m/z): 343 (M$^+$).

Example 5

Synthesis of 2,2,5-Trimethyl-5-hydroxymethyl-1,3-dioxane 4-toluenesulfonic acid monohydrate (0.4 g) was added to a solution of 1,1,1-tris(hydroxymethyl)ethane (50.4 g) in acetone (dried over calcium chloride, 550 ml) and stirred at room temperature for 3 days. Potassium carbonate (2.0 g) was added, and the mixture was filtered and concentrated. The residue was taken in dichloromethane (200 ml), and the solution was washed with water (2×75 ml), dried, and concentrated. The residual liquid, 54.75 g, was distilled to obtain a colorless liquid, 52.36 g (78% yield), b.p. 65-67° C./0.3 mm Hg.

An alternative procedure is as follows: 4-toluenesulfonic acid monohydrate (51.3 g) in acetone (275 ml) was stirred with 2,2-dimethoxy propane (75 ml) and toluenesulfonic acid monohydrate (1.3 g) for 18 hours at room temperature, and worked up in a similar manner as indicated in the procedure above to afford 52.12 g (76% yield), b.p. 72-75° C./0.65 mm Hg. Mass spec: m/z 161 (M$^+$+1). Anal Calcd for C$_8$H$_{15}$O$_3$: C, 59.98; H, 10.07%. Found: C, 59.62; H, 10.07%. $^1$H NMR (CDCl$_3$) δ ppm: 0.83 (s, 3H), 1.40 (s, 3H), 1.44 (s, 3H), 3.59-3.69 (m, 6H). $^{13}$C NMR: 17.69, 20.25, 27.41, 34.86, 65.90, 66.43, 98.1 (7 sp$^3$C).

Example 6

Synthesis of 2,2,5-Trimethyl-5-[(3-bromophenoxy)]methyl-1,3-dioxane via Ulmann Ether Reaction A mixture of 3-bromoiodobenzene (0.85 g, 3.0 mmol), 2,2,5-trimethyl-5-hydroxymethyl-1,3-dioxane (1.25 g, 7.8 mmol), copper (I) iodide (0.065 g, 0.38 mmol), 1,10-phenanthroline (0.122 g, 0.68 mmol), and cesium carbonate (2.54 g, 7.8 mmol) was heated to 110° C. in an oil bath and held at this temperature for 20 hours. After cooling, the mixture was diluted with toluene and filtered, and the filtrate was transferred to a column of silica gel. Elution with toluene produced a colorless liquid product, 0.56 g (59% yield). The product solidifies on standing with hexanes, m.p. 66-67° C. Mass spec: m/z 314, 316 (M). Anal Calcd for C$_{14}$H$_{19}$BrO$_3$: C, 53.34; H, 6.08; Br, 25.35%. Found: C, 52.98; H, 5.91; Br, 25.44%. $^1$H NMR (CDCl$_3$) δ ppm: 0.94 (s, 3H), 1.41 (s, 3H), 1.47 (s, 3H), 3.73 (dd, J=12 Hz, 2H), 4.00 (s, 2H), 6.85-6.88 (m, 1H), 7.06-7.08 (m, 1H), 7.10-7.15 (m, 2H).

Example 7

Synthesis of 2,2,5-Trimethyl-5-[(3-bromophenoxy)]methyl-1,3-dioxane via Mitsunobu Reaction To a mechanically stirred mixture of 3-bromophenol (26.14 g, 0.1511 mol), 2,2,5-trimethyl-5-hydroxymethyl-1,3-dioxane (31.98 g, 0.20 mol), triphenylphosphine (59.32 g, 0.226 mol), and THF (250 ml) cooled to −2° C., a solution of diisopropyl azodicarboxylate (DIAD), 4.6 ml, 0.2265 mol) in THF (50 ml) was added drop-wise over 45 minutes, and the mixture was allowed to warm up to room temperature. After 3 days, the THF was removed, and the residue was stirred in a mixture of toluene and heptane (1:1, 300 ml) and filtered. The solids were washed with the same mixture of solvents (200 ml), and the combined filtrates were washed with dilute sodium hydroxide solution, water, and saturated sodium chloride solution, before being dried and concentrated. The residue was chromatographed over silica gel. Elution with toluene-heptane (1:1) removed some unreacted triphenylphosphine. The product came in toluene-heptane (3:1) eluates, and on standing with pentane, solidified, 40.69 g (85% yield), m.p. 67-70° C. Mass spec: m/z 314, 316 (M$^+$). Anal Calcd for C$_{14}$H$_{19}$BrO$_3$: C, 53.34; H, 6.08; Br, 25.35%. Found: C, 53.37; H, 5.97; Br, 25.35%.

Example 8

Synthesis of 3-[5-(2,2,5-trimethyl-1,3-dioxanyl)methoxy]-diphenylamine

A mixture of 2,2,5-trimethyl-5-(3-bromophenoxy)-methyl-1,3-dioxane (7.88 g, 25.0 mmol), aniline (4.6 ml, 50.0 mmol), and toluene (100 ml) was azeotroped dry under nitrogen and cooled. Bis(dibenzylideneacetone)palladium(0) (0.172 g, 0.3 mmol), 1,1'-bis(diphenylphosphino)ferrocene (0.21 g, 0.38 mmol), and sodium t-butoxide (3.64 g, 37.9 mmol) were added, and the mixture was held at 88° C. for 4 hours. After cooling, the mixture was treated with water, and the organic phase was dried and transferred to a column of silica gel. Elution with toluene produced the product, which on standing in hexanes solidified, 7.2 g (88% yield), m.p. 93-96° C. Recrystallization from heptane raised the m.p. to 104-105° C. in 97% recovery. Mass spec: m/z 327 (M$^+$). Anal Calcd for C$_{20}$H$_{25}$O$_3$: C, 73.37; H, 7.70; N, 4.28%. Found: C, 73.21; H, 7.62; N, 4.13%. $^1$H NMR (CDCl$_3$) δ ppm: 0.95 (s, 3H), 1.40 (s, 3H), 1.46 (s, 3H), 3.66 (d, J=12 Hz, 2H), 3.80 (d, J=12.1 Hz, 2H), 3.96 (s, 2H), 6.69 (broad s, 1H), 6.49-6.52 (m, 1H), 6.63-6.66 (m, 2H), 6.92-6.96 (m, 1H), 7.07-7.7.10 (m, 2H), 7.15 (t, J=8.08 Hz, 1H), 7.25-7.29 (m, 2H). $^{13}$C NMR: 18.16, 20.38, 27.36, 34.30, 66.50, 70.50 (6 sp$^3$C), 98.14, 104.18, 107.04, 110.37, 118.36, 121.29, 129.49, 130.16, 143.04, 144.59, 160.54 (11 sp$^2$C).

Example 9

Synthesis of 2,4,6-Tris(7-bromo-9,9-diethylfluoren-2-yl)-1,3,5-triazine 7-bromo-9,9-diethylfluorene-2-carbonitrile (10.17 g) was added in portions to trifluoromethanesulfonic acid (11.0 ml) cooled in a bath of ice and salt and then allowed to warm up to room temperature. After 24 hours, the thick reaction mixture was diluted with chloroform (10 ml), and stirred for an additional 24 hours. The mixture was then poured into crushed ice, and the slurry was treated with ammonium hydroxide until the mixture became colorless. The chloroform was allowed to evaporate, and the mixture was filtered to obtain the crude triazine, 10.62 g. The triazine was recrystallized from a mixture of toluene and heptanes with clarification, and the product was dried at 150° C., 9.68 g (95% Yield), m.p. 175-177° C. Mass spec: m/z 975, 977, 979, 981 (M$^+$). Anal Calcd for C$_{54}$H$_{48}$N$_3$Br$_3$: C, 66.27; H, 4.94; N, 4.29; Br, 24.49%. Found: C, 66.65; H, 5.04; N, 4.27; Br, 24.63%. $^1$H NMR (CDCl$_3$) δ ppm: 0.43 (t, J=7.32 Hz, 18H), 2.13 (sextet, J=6.95 Hz, 6H), 2.26 (sextet, J=7.13 Hz, 6H), 7.53-7.56 (m, 6H), 7.70 (d, J=7.92 Hz, 3H), 7.91 (d, J=7.92 Hz, 3H), 8.74 (d, J=1.04 Hz, 3H), 8.86 (dd, J=1.46 and 7.98 Hz, 3H). $^{13}$C NMR: 8.75, 32.85, 56.84 (3 sp$^3$C), 120.05, 122.01, 122.45, 123.42, 126.63, 128.75, 130.45, 135.69, 139.86, 145.09, 150.12, 153.45, and 171.83 (13 sp$^2$C).

Example 10

Synthesis of 2,4,6-Tris{7-(3-[5-(2,2,5,-trimethyl-1,3-dioxanyl)methoxy]diphenylamino)-9,9-diethylfluoren-2-yl}-1,3,5-triazine A mixture of 2,4,6-tris(7-bromo-9,9-diethylfluoren-2-yl)-1,3,5-triazine (10.3 g, 10.5 mmol), 3-[5-(2,2,5-trimethyl-1,3-dioxanyl)methoxy]-diphenylamine (10.83 g, 33.1 mmol), and toluene (225 ml) was azeotroped dry under nitrogen, and cooled. Bis(dibenzylideneacetone)palladium(0) (0.28 g, 0.49 mmol), 1,1'-bis(diphenylphosphino)ferrocene (0.278 g, 0.5 mmol), and sodium t-butoxide (4.52 g, 47.0 mmol) were then added, and the mixture was held at 75° C. for 20 hours. After cooling, the mixture was diluted with toluene and water, and the organic phase was washed with water, dried, and concentrated. The column was first eluted with toluene to remove the diphenylamine starting material, followed by 2% ethyl acetate-toluene to obtain the product, 16.58 g (92% yield). The solvent-free product had a m.p. of 143-146° C. MALDI (terthiophene as matrix) mass spec: m/z 1717.7, 1718.7, 1719.7, 1720.7, 1721.8, 1722.8. Anal Calcd for $C_{114}H_{120}N_6O_9$: C, 79.69; H, 7.04; N, 4.89. Found: C, 79.81; H, 7.04; N, 4.80%. $^1$H NMR (CDCl$_3$) δ ppm: 0.46 (t, J=7.3 Hz, 18H), 0.92 (s, 9H), 1.38 (s, 9H), 1.44 (s, 9H), 2.02 (sextet, J=7.03, 6H), 2.19 (sextet, J=6.95 Hz, 6H), 3.63 (d, J=12 Hz, 6H), 3.77 (d, J=11.96 Hz, 6H), 3.92 (s, 6H), 6.63 (dd, J=1.84, and 8.16 Hz, 3H), 6.70-6.75 (m, 6H), 7.04-7.31 (m, 24H), 7.69 (d, J=8.20 Hz, 3H), 7.84 (d, J=8.0 Hz, 3H), 8.72 (s, 3H), 8.84 (dd, J=1.40, and 8.00 Hz, 3H). $^{13}$C NMR: 8.86, 18.13, 20.26, 27.42, 32.80, 34.25, 56.42, 66.44, 70.42 (9 sp$^3$C), 98.12, 108.94, 110.56, 116.74, 119.19, 119.23, 121.37, 123.06, 123.19, 123.58, 124.56, 128.67, 129.39, 129.93, 134.57, 135.79, 145.99, 147.90, 148.23, 149.16, 150.34, 152.66, 160.29, 71.80 (24 sp$^2$C).

Example 11

Synthesis of 2,4,6-Tris{7-[3-(2,2-di(hydroxymethyl)-propyloxy)]diphenylamino]-9,9-diethylfluoren-2-yl)}-1,3,5-triazine (AF-452-6H)

Dowex® resin (Dowex-50WX2-100, 50 g) (The Dow Chemical Company), was suspended in methanol, filtered, and washed with additional methanol. The washed Dowex resin was added to a solution of 2,4,6-tris {7-(3-[5-(2,2,5,-trimethyl-1,3-dioxanyl)methoxy]diphenylamino)-9,9-diethylfluoren-2-yl}-1,3,5-triazine (10 g) in a mixture of THF (200 ml) and methanol (200 ml), and the mixture was stirred at 40° C. for 22 hours. After cooling to room temperature, 28% ammonium hydroxide (20 ml) was added, and the mixture was filtered. The resin was washed with THF containing ammonium hydroxide, and the filtrate was concentrated. The residue was suspended in toluene (100 ml), and the suspension was concentrated. The residue was then transferred to a column of silica gel. The column was first eluted with ethyl acetate, followed by 10% THF-ethyl acetate. The residue remaining after concentration of the latter fractions was dissolved in THF (100 ml) and water (50 ml) and treated with lithium hydroxide monohydrate (2.13 g). After 6 hours at 45° C., the ethyl acetate free product solution was treated with ammonium chloride (2.7 g) to discharge the orange color and then concentrated. The product suspension in water was collected, re-dissolved in THF (100 ml) and water (40 ml), and filtered. The THF was removed using a stream of nitrogen, and the lost volume was periodically made up with water. The suspension of the product was filtered and dried, 8.34 g (90%), m.p. 186-189° C. MALDI mass spec: m/z 1597.0, 1598.0, 1599.0, 1600.1 (M$^+$). Anal Calcd for $C_{105}H_6O_9$: C, 78.92; H, 6.81; N, 5.26%. Found: C, 78.74; H, 6.90; N, 5.15%. $^1$H NMR (CDCl$_3$) ppm: 0.46 (t, 18H), 0.92 (s, 9H), 2.02 (m, 6H), 2.15 (m, 6H), 2.18 (m, 6H), 3.65 (m, 6H), 3.74 (m, 6H), 3.88 (s, 6H), 6.68 (d, 3H), 6.83 (m, 6H), 7.04 (m, 6H), 7.16 (m, 12H), 7.36 (m, 6H), 7.69 (d, 3H), 7.86 (d, 3H), 8.51 (s, 3H), 8.85 (d, 3H). $^{13}$C NMR: 8.71, 17.08, 32.64, 40.71, 56.27, 67.90, 71.40 (7 sp$^3$C), 108.75, 110.03, 116.80, 119.10, 121.26, 123.08, 123.52, 124.50, 128.56, 129.29, 129.90, 134.49, 135.78, 145.77, 147.67, 147.99, 149.16, 150.18, 152.55, 159.73, and 171.66 (21 sp2C).

Example 12

Synthesis of AF-452-6OH-Hexaacetate

Acetic anhydride (2 ml) was added to a cooled solution of 2,4,6-tris{7-[3-(2,2-di(hydroxymethyl)-propyloxy)]diphenylamino]-9,9-diethylfluoren-2-yl}-1,3,5-triazine (AF-452-6OH, 0.418 g) in pyridine (3 ml), and the mixture was poured into water. The separated solids were transferred to a column of silica gel, and the column was eluted with 20% ethyl acetate/toluene to get the hexaacetate (0.358 g). A mass spectrum was not obtained due to decomposition of the compound under electron impact conditions. Anal Calcd for $C_{117}H_{120}N_6O_{15}$: C, 75.95; H, 6.54; N, 4.54%. Found: C, 75.72; H, 6.64; N, 4.29%. $^1$H NMR (CDCl$_3$) δ ppm: 0.46 (t, 18H), 1.06 (s, 9H), 2.02 (s, 18H), 2.00-2.03 (m, 6H), 2.04-2.20 (m, 6H), 3.76 (s, 6H), 4.08 (s, 12H), 6.56-6.58 (dd, 3H), 6.68-6.74 (m, 6H), 7.01-7.09 (m, 6H), 7.15-7.19 (m, 12H), 7.26-7.32 (m, 6H), 7.70 (d, 3H), 7.84 (d, 3H), 8.72 (s, 3H), and 8.84 (dd, 3H).

Example 13

Desmodur® W+AF-452-6OH

To a solution of Desmodur® W (cyclo-aliphatic diisocyanate; 51.0 mg) (Bayer MaterialScience) and AF-452-6OH (80 mg) in ethyl acetate (220 mg) was added 10 µL of 0.0005 wt % dibutyltin dilaurate solution in hexane. The mixture was cured for 48 hours at room temperature in a partially sealed vial to a cloudy rubber state.

Example 14

Desmodur® Z 4470 SN+AF-452-6OH

Desmodur® Z 4470 SN (isophorone diisocyanate; 73 mg) (Bayer MaterialScience) and AF-452-6OH (53 mg) were dissolved in ethyl acetate (150 mg), and the mixture was cured for 48 hours at room temperature in a sealed vial to a cloudy rubber state.

Example 15

Desmodur® IL BA+AF-452-6OH

Desmodur® IL BA (toluene diisocyanate; 141.5 mg) (Bayer MaterialScience) and AF-452-6OH (68.3 mg) were dissolved in ethyl acetate (200 mg). The mixture was cured for 24 hours at room temperature in a sealed vial and 18 hours at 70° C./0.3 torr to yield a hard, yellow, optically clear glass.

Example 16

Desmodur® 3300A+AF-452-6OH

Desmodur® 3300A (45 mg; Desmodur N 3300A is a solvent-free, polyfunctional, aliphatic isocyanate resin based on hexamethylene diisocyanate) (Bayer MaterialScience) and AF-452-6OH (58.5 mg) were dissolved in ethyl acetate (150 mg). The mixture was cured for 24 hours at room temperature in a sealed vial, 24 hours in an open vial, and 24 hours at 75° C. to yield a hard, optically clear glass.

Example 17

Desmodur® RFE+AF-452-6OH

Desmodur® RFE (146.6 mg; Desmodur RFE polyisocyanate is a solution of tris(p-isocyanatophenyl)thiophosphate, 27% in ethyl acetate) (Bayer MaterialScience) and AF-452-6OH (64 mg) were dissolved in ethyl acetate (25 mg). The mixture was cured for 24 hours at room temperature in a sealed vial and 18 hours at 70° C./0.3 torr to yield a hard, optically clear glass that was a deep reddish-purple, most likely due to the acidity of the Desmodur RFE product.

Example 18

Desmodur® N 3200+AF-452-6OH (1) Desmodur® N 3200 (N,N',N"-tris(6-isocyanatohexamethylene)biuret; 115.7 mg) (Bayer MaterialScience) and AF-452-6OH (156.5 mg) were dissolved in ethyl acetate (414 mg). The mixture was cured for 48 hours at room temperature in a sealed vial to a give a viscous liquid. The cap was removed, and the vial was placed in a sealed oven for 48 hours to produce a soft rubber. The temperature was increased to 80° C. for 24 hours to produce a hard, optically-clear glass with a large meniscus. Isothermal aging at 150° C. by TGA showed that most weight loss had occurred during the first 5 hour period, and after 90 hours, 13 wt % (solvent) remained.

(2) Desmodur N 3200 (228 mg) and AF-452-6OH (297.6 mg) were dissolved in ethyl acetate (800 mg) and filtered through a 0.2 μm PTFE syringe filter into a mold made from an inverted PTFE liner for a 14/20 ground glass joint that had been epoxied onto a microscope slide. The mixture was cured for 21 hours at room temperature in a sealed oven to a produce a gel. The temperature was increased to 80° C., and striations were evident within 0.5 hours.

(3) Desmodur N 3200 (228 mg) and AF-452-6OH (297.6 mg) were dissolved in ethyl acetate (800 mg) and filtered through a 0.2 m PTFE syringe filter into a mold made from an inverted PTFE liner for a 14/20 ground glass joint that had been epoxied onto a microscope slide. The mixture was cured for 5 days at room temperature in a sealed oven, and then the temperature was increased to 75° C. for 24 hours to obtain a hard glass. The sample was removed from the mold by soaking in distilled water overnight and was polished to 1 mm thickness.

(4) Desmodur N 3200 (30.2 mg) and AF-452-6OH (40.9 mg) were dissolved in ethyl acetate (4.89 g, 1.2 wt % solids) and filtered through a 0.2 μm PTFE syringe filter onto glass or sapphire substrates for spin coating at 2,000 rpm for 30 seconds, followed by 3,000 rpm for 30 seconds. Generally, the results were better for glass substrates.

(5) Desmodur N 3200 (35.7 mg) and AF-452-6OH (48 mg) were dissolved in ethyl acetate (2.56 g, 3.2 wt % solids) and filtered through a 0.2 μm PTFE syringe filter onto a silicon substrate for spin coating at 1,000 rpm for 30 seconds. A second sample was prepared at 2,000 rpm for 30 seconds. Both samples were then placed in a sealed oven at 80° C. overnight.

Example 19

Curing of Desmodur® N 3200+AF-452-6OH+a Diol (1) To a solution of Desmodur® N 3200 (N,N',N"-tris(6-isocyanatohexamethylene)biuret; 1.67 g) (Bayer MaterialScience) and AF-452-6OH (0.015 g) in ethyl acetate (2 ml) was added 1,6-hexanediol (0.47 g), and the mixture was blended at 3,500 rpm for 2 minutes. To keep the diol in solution, the reaction mixture was placed in a thermostated oil bath at 73° C. for 16 hours to yield a rubbery solid. Further curing at 100° C. and 0.6 torr for 2 hours produced a cracked solid.

(2) A warm solution of Desmodur N 3200 (1.720 g) and 1,6-hexanediol (0.47 g) in ethyl acetate (1.0 ml) was thoroughly mixed and divided into two 1 dram vials. AF-452-6OH (11.0 mg) was dissolved in one vial, and a catalytic amount of dibutyltin dilaurate was added to both vials. Both materials were cured for 24 hours at room temperature to a hard, optically-clear rubber state and were then placed in a 75° C. oven for 48 hours to further harden.

(3) AF-452-6OH (152.7 mg) and 1,4-butanediol (25.9 mg) were dissolved in ethyl acetate (206 mg) and added to Desmodur N 3200 (220 mg). This mixture was diluted with ethyl acetate (200 mg) and filtered through a 0.2 μm PTFE syringe filter into a mold made from an inverted PTFE liner for a 14/20 ground glass joint that had been epoxied onto a microscope slide. The mixture was cured for 12 days at room temperature in a sealed oven, and then the temperature was increased to 75° C. for 48 hours to give a hard glass that was slightly cloudy.

(4) Desmodur N 3200 (222 mg) and 2,2,3,3,4,4,5,5-octafluorohexane-1,6-diol (152 mg) were dissolved in ethyl acetate (500 mg) and poured onto a 1 inch square glass slide previously cleaned with methanol. The sample was left covered with a beaker in a hood for 24 hours and was then placed in a vacuum oven for 24 hours at 70° C., followed by 5 hours at 70° C./0.5 torr to give an optically clear film.

(5) Desmodur N 3200 (127 mg) and 2,2,3,3,4,4,5,5,6,6,7,7,8,8,9,9,10,10,11,11-icosafluorododecane-1,12-diol (187 mg) were dissolved in ethyl acetate (553 mg) and poured onto a 1 inch square glass slide previously cleaned with methanol. The sample was left covered with a beaker in a hood for 24 hours and was then placed in a vacuum oven for 24 hours at 70° C., followed by 5 hours at 70° C./0.5 ton to give a phase-separated film.

Example 20

Desmodur® N 3200+AF-452-6OH+6F-BPA (1) AF-452-6OH (153.4 mg) and 2,2-di(4-hydroxyphenyl)-1,1,1,3,3,3-hexafluoro-propane (6F-BPA; 25.9 mg) were dissolved in ethyl acetate (204 mg) and added to Desmodur® N 3200 (N,N',N"-tris(6-isocyanatohexamethylene)biuret; 220 mg) (Bayer MaterialScience). This mixture was diluted with ethyl acetate (200 mg) and filtered through a 0.2 μm PTFE syringe filter into a mold made from an inverted PTFE liner for a 14/20 ground glass joint that had been epoxied onto a microscope slide. The mixture was cured for 12 days at room temperature in a sealed oven, and then the temperature was increased to 75° C. for 48 hours to give a hard, optically clear glass.

(2) Desmodur N 3200 (2.46 g) and 6F-BPA (2.16 g) were dissolved in ethyl acetate (4.6 g), and the solution was divided equally among five 1 dram vials. Portions of a stock solution of AF-452-6OH in ethyl acetate ($1.08 \times 10^{-3}$ M) were added to the vials in the following amounts: 0, 1, 10, 100, and 1000 μL. The vials were placed unsealed in an oven at 70° C. for 1 hour and then poured onto 1 inch square glass slides previously cleaned with methanol. The samples were left covered with a beaker in a hood for 24 hours and were then placed in a vacuum oven for 4 hours at 70° C., 1 hr at 100° C./300 torr, and 3 hours at 150° C./300 torr.

(3) Desmodur N 3200 (223 mg), 6F-BPA (161.8 mg), and AF-452-6OH (51.8 mg) were dissolved in ethyl acetate (925 mg) in a vial. The vial was placed sealed in an oven at 80° C. for 1 hour, and the solution was filtered through a 0.2 μm PTFE syringe filter onto a 1 inch square glass slide previously cleaned with methanol. The sample was left covered with a beaker in a hood for 48 hours and was then placed in a vacuum oven for 24 hours at 80° C., 24 hours at 80° C./0.5 torr, and 24 hours at 150° C./0.5 torr.

(4) Desmodur N 3200 (243 mg), 6F-BPA (213 mg), and AF-452-6OH (6.1 mg) were dissolved in ethyl acetate (840 mg) in a vial. The vial was placed sealed in an oven at 80° C. for 1 hour, and the solution was filtered through a 0.2 μm PTFE syringe filter onto a 1 inch square glass slide previously cleaned with methanol. The sample was left covered with a beaker in a hood for 48 hours and was then placed in a vacuum oven for 24 hours at 80° C., 24 hours at 80° C./0.5 torr, and 24 hours at 150° C./0.5 torr.

(5) Desmodur N 3200 (863 mg), 6F-BPA (759 mg), and AF-452-6OH (2.0 mg) were dissolved in ethyl acetate (760 mg). The solution was filtered through a 0.2 μm PTFE syringe filter into a ½ dram vial and was left sealed for 64.5 hours. The lid was partially opened, and the sample left for another 6 days. Finally, the lid was removed, and the sample was placed in an oven at 80° C. for 24 hours.

Example 21

Desmodur® N 3200+AF-452-6OH+Catalyst (Dibutyltin Dilaurate)

(1) A warm solution of Desmodur® N 3200 (N,N',N"-tris (6-isocyanatohexamethylene)biuret; 1.720 g) (Bayer MaterialScience) and 1,6-hexanediol (0.47 g) in ethyl acetate (1.0 ml) was thoroughly mixed and divided into two 1 dram vials. AF-452-6OH (11.0 mg) was dissolved in one vial, and a catalytic amount of dibutyltin dilaurate was added to both vials. Both materials were cured for 24 hours at room temperature to a hard, optically-clear rubber state and were then placed in a 75° C. oven for 48 hours to further harden.

(2) To a solution of Desmodur N 3200 (63.5 mg) and AF-452-6OH (85.6 mg) in ethyl acetate (200 mg) was added 10 μL of 0.005 wt % dibutyltin dilaurate solution in hexane. The mixture was cured for 48 hours at room temperature in a partially sealed vial to a hard, optically-clear rubber state and was then placed in an 80° C. oven overnight to further harden. The resulting material was clear but contained optical stria.

Example 22

Desmodur® W+AF-452-6OH+Catalyst (Dibutyltin Dilaurate)

To a solution of Desmodur® W (cyclo-aliphatic diisocyanate; 51.0 mg) (Bayer MaterialScience) and AF-452-6OH (80 mg) in ethyl acetate (220 mg) was added 10 μL of 0.005 wt % dibutyltin dilaurate solution in hexane. The mixture was cured for 48 hours at room temperature in a partially sealed vial to a cloudy rubber state.

Having thus described exemplary embodiments of the present invention, it should be noted by those skilled in the art that the disclosures herein are exemplary only, and that alternatives, adaptations, and modifications may be made within the scope of the present invention.

What is claimed is:

1. Two-photon active cross-linked polyurethane compositions derived from polymerization of (i) a difunctional isocyanato monomer, (ii) a trifunctional isocyanato monomer, or (iii) mixtures thereof; and a polyhydroxy tris(diarylamino-9,9-dialkylfluorenyl)-1,3,5-triazine with the following structure:

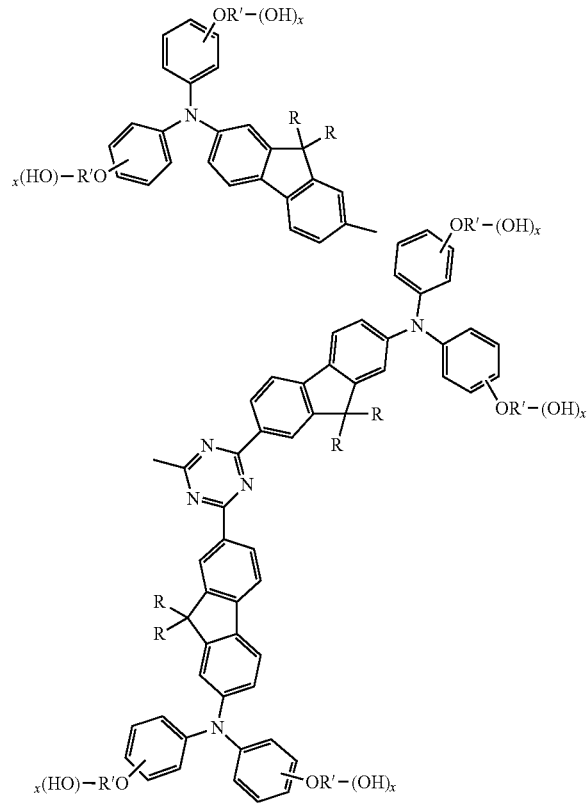

wherein R is a linear or branched alkyl group or an alkylether group; and wherein R' is a linear or branched alkyl group, the OR'—$(OH)_x$ groups being located in a meta or para position with respect to the triarylamine nitrogen, wherein x is from 1 to 3.

2. The two-photon active cross-linked polyurethane compositions of claim 1 having the following structure:

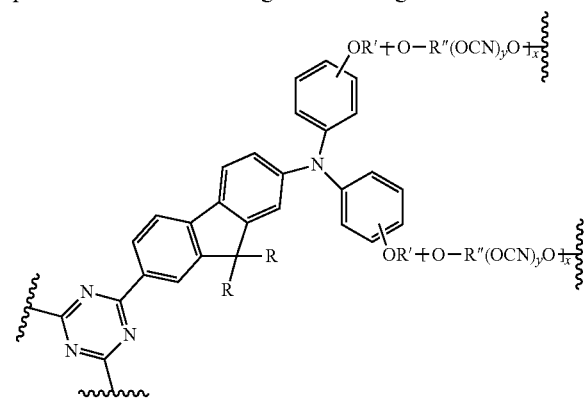

wherein y is 2 or 3;

wherein the difunctional isocyanato monomer, $R''(OCN)_2$, is selected from the group wherein R" consists of methylene-1,1'-di(4-phenyl)-; toluene-2,5-(difunctionalized)-; 1,3,3-trimethyl-5-(functionalized)-cyclohexylmethylene-; α,ω-$(CH_2)$m-, wherein m is from 4 to 12; and methylene-1,1'-di(4-cyclohexyl)-; and wherein the trifunctional isocyanato monomer, $R''(OCN)_3$, is selected from the group wherein R" consists of 4,4',4"-(trifunctionalized)-triphenylthiophosphate; 4,4',4"-(trifunctionalized)-triphenylmethane; isocyanurate-N,N',N'''-tris-4-(2-toluenyl)-; propane-3,3,3-tris-(4-iminecarbonyloxymethyl-2-toluenyl)-; isocyanurate-N,N',N"-tri-ω-alkyl-; and biuret-N,N',N"-tri-ω-alkyl-.

3. The two-photon active cross-linked polyurethane compositions of claim 1 wherein diphenylmethane-4,4'-diisocyanate is used as the difunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

4. The two-photon active cross-linked polyurethane compositions of claim 1 wherein toluene-2,5-diisocyanate is used as the difunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

5. The two-photon active cross-linked polyurethane compositions of claim 1 wherein isophorone diisocyanate is used as the difunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

6. The two-photon active cross-linked polyurethane compositions of claim 1 wherein 1,6-hexamethylene diisocyanate is used as the difunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

7. The two-photon active cross-linked polyurethane compositions of claim 1 wherein bis(4-isocyanatocyclohexyl)methane is used as the difunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

8. The two-photon active cross-linked polyurethane compositions of claim 1 wherein bis(4-isocyanatocyclohexyl)methane is used as the difunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

9. The two-photon active cross-linked polyurethane compositions of claim 1 wherein N,N',N''-tris(6-isocyanatohexamethylene)biuret is used as the trifunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

10. The two-photon active cross-linked polyurethane compositions of claim 1 wherein 2,4,6-tris(6-isocyanatohexamethylene)isocyanurate is used as the trifunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

11. The two-photon active cross-linked polyurethane compositions of claim 1 wherein tris(p-isocyanatophenyl)thiophosphate is used as the trifunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

12. The two-photon active cross-linked polyurethane compositions of claim 1 wherein 3,3,3-tris-[4(2-isocyanatotoluenyl)iminecarbonyloxymethyl]-propane is used as the trifunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

13. The two-photon active cross-linked polyurethane compositions of claim 1 wherein tris(4-isocyanatophenyl)methane is used as the trifunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

14. The two-photon active cross-linked polyurethane compositions of claim 1 wherein N,N',N''-tris-4(2-isocyanatotoluenyl)isocyanurate is used as the trifunctional isocyanato monomer to react with the polyhydroxy tris(diarylamino-9,9-dialkylfluorenyl)-1,3,5-triazine in an equivalent molar ratio range of NCO (isocyanate):OH (hydroxyl) from 0.9:1.0 to 0.9:1.10.

15. Two-photon active cross-linked polyurethane compositions derived from polymerization of (i) a difunctional isocyanato monomer, (ii) a trifunctional isocyanato monomer, or (iii) mixtures thereof; and a polyhydroxy tris(diarylamino-9,9-dialkylfluorenyl)-1,3,5-triazine having the following structure:

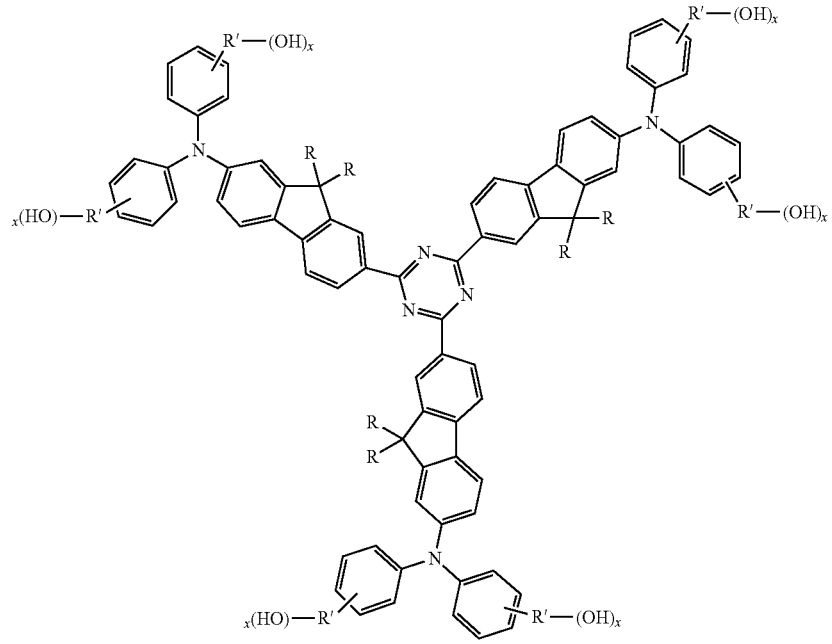

wherein R is a linear or branched alkyl group or an alkylether group; and wherein R' is a linear or branched alkyl group, the R'—(OH), groups being located in a meta or para position with respect to the triarylamine nitrogen, wherein x is from 1 to 3.

16. The two-photon active cross-linked polyurethane compositions of claim 15 having the following structure:

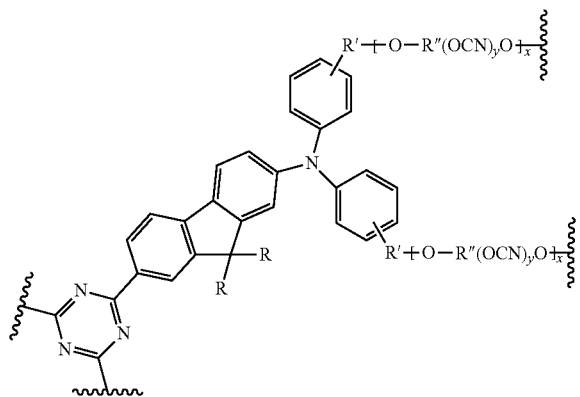

wherein y is 2 or 3;

wherein the difunctional isocyanato monomer, R"(OCN)$_2$, is selected from the group wherein y consists of methylene-1,1'-di(4-phenyl)-; toluene-2,5-(difunctionalized)-; 1,3,3-trimethyl-5-(functionalized)-cyclohexylmethylene-; α,ω-(CH$_2$)m-, wherein m is from 4 to 12; and methylene-1,1'-di(4-cyclohexyl)-; and wherein the trifunctional isocyanato monomer, R"(OCN)$_3$, is selected from the group wherein R" consists of 4,4',4"-(trifunctionalized)-triphenylthiophosphate; 4,4',4"-(trifunctionalized)-triphenylmethane; isocyanurate-N,N',N"-tris-4-(2-toluenyl)-; propane-3,3,3-tris-(4-iminecarbonyloxymethyl-2-toluenyl)-; isocyanurate-N,N',N"-tri-ω-alkyl-; and biuret-N,N',N"-tri-ω-alkyl-.

17. The two-photon active cross-linked polyurethane compositions of claim 16 wherein a combination of at least one difunctional isocyanato monomer and at least one trifunctional isocyanato monomer react with the polyhydroxy tris (diarylamino-9,9-dialkylfluorenyl)-1,3,5-triazine in an equivalent molar ratio range of NCO (isocyanate):OH (hydroxyl) from 0.9:1.0 to 0.9:1.10, wherein the difunctional isocyanato monomer is selected from the group consisting of diphenylmethane-4,4'-diisocyanate; toluene-2,5-diisocyanate; isophorone diisocyanate; 1,6-hexamethylene diisocyanate; bis(4-isocyanatocyclohexyl)methane; and bis(4-isocyanatocyclohexyl)methane; and wherein the trifunctional isocyanato monomer is selected from the group consisting of N,N',N"-tris(6-isocyanatohexamethylene)biuret; 2,4,6-tris (6-isocyanatohexamethylene)isocyanurate; tris(p-isocyanatophenyl)thiophosphate; 3,3,3-tris-[4(2-isocyanatotoluenyl)iminecarbonyloxymethyl]-propane; tris(4-isocyanatophenyl)methane; and N,N',N"-tris-4(2-isocyanatotoluenyl)isocyanurate.

* * * * *